United States Patent [19]

Schlotterer et al.

[11] Patent Number: 5,844,781
[45] Date of Patent: Dec. 1, 1998

[54] ELECTRICAL DEVICE SUCH AS A NETWORK PROTECTOR RELAY WITH PRINTED CIRCUIT BOARD SEAL

[75] Inventors: John Carl Schlotterer, Franklin; James Leo Lagree, McKees Rocks, both of Pa.

[73] Assignee: Eaton Corporation, Cleveland, Ohio

[21] Appl. No.: 715,317

[22] Filed: Sep. 16, 1996

[51] Int. Cl.$^6$ ........................................ H05K 5/00
[52] U.S. Cl. .................... 361/752; 361/796; 361/803; 361/736; 361/772; 174/50.5; 174/52.1; 174/52.2
[58] Field of Search ........................... 361/819, 752, 361/796, 803, 736, 679, 772–774, 777–779, 760; 174/17 CT, 50.54, 50.53, 50.52, 50.51, 50.5, 255, 52.1, 52.2

[56] References Cited

U.S. PATENT DOCUMENTS

| | | | |
|---|---|---|---|
| 3,501,582 | 3/1970 | Heidler et al. | 174/52.2 |
| 4,142,179 | 2/1979 | Lowndes | 340/321 |
| 4,594,644 | 6/1986 | Painter et al. | 361/807 |
| 5,227,955 | 7/1993 | Le Bris et al. | 361/743 |
| 5,270,903 | 12/1993 | McMichen et al. | 361/760 |

*Primary Examiner*—Leo P. Picard
*Assistant Examiner*—Phuong T. Vu
*Attorney, Agent, or Firm*—Martin J. Moran

[57] ABSTRACT

An electrical device such as a network protector relay is protected from ambient conditions by a housing having a printed circuit board (PCB) providing a seal for the housing and air and water tight connections between relay leads and external leads. The relay leads are soldered in first plated through apertures in the PCB substrate while the external leads are soldered in second plated through apertures connected to corresponding first apertures by conductive traces on the substrate. Potting material confined by a potting dam electrically insulates the solder connections on the external side of the PCB. Components can be mounted on either side of the substrate by soldering the component pins or leads in additinal plated through apertures electrically connected to relay and/or external leads by the conductive traces. Components such as connectors or indicators, including, for example, light emitting diodes, can be supported in the potting dam and connected to appropriate ones of the external leads insulated by the potting material.

4 Claims, 4 Drawing Sheets

ELECTRICAL DEVICE SUCH AS A NETWORK PROTECTOR RELAY WITH PRINTED CIRCUIT BOARD SEAL

BACKGROUND OF THE INVENTION

1. Field of the Invention

This invention relates to electrical devices which are protected from ambient conditions by sealing them in an air and water tight housing through which electrical leads for the device must extend. It has particular application to protective relays for network protectors and uses a printed circuit board, through which the external electrical connections to the device are made, as a cover for the housing.

2. Background Information

In many installations, it is necessary to protect an electrical device from environmental conditions while providing the device with external connections to other apparatus. One such installation is the relay for a network protector. The network protector is apparatus used to control the flow of electrical power to a distribution network such as a section of a city, a large building, or an industrial site. Such a network is fed at multiple points through transformers. The network protector includes a circuit breaker and a relay which opens the circuit to the transformer upon detection of abnormal current flow.

Typically, the transformer is mounted in a vault, frequently underground. As the vault can contain water and the transformer can over heat and even catch on fire, the circuit breaker and its protective relay are mounted in a sealed tank. However, to further protect the relay, it is mounted inside a sealed housing within the tank. The protective relay requires numerous electrical connections such as to current transformers which sense the network currents and to the circuit breaker. Feed throughs in which the insulated wires from the relay are clamped by a rubber gasket at the penetration through the housing have not proved satisfactory, even if the gasket is sealed tightly around the leads, as air and moisture can leak between the conductor and the insulation and along the individual strands of stranded leads. Now, the practice is to use feed throughs in which glass plugs fuse short sections of wire in apertures in a metal plate. The relay wires are soldered to loops on the inner ends of the feed throughs, while corresponding external leads are soldered to loops on the outer ends. Such feed throughs are expensive.

There is a need therefore for improved arrangements for making electrical connections to electrical devices enclosed in a housing, and in particular to network protector relays.

There is a need for providing such improved arrangements which are economical and practical to implement.

There is a further need for such arrangements which are air tight and water tight.

SUMMARY OF THE INVENTION

These needs and others are satisfied by the invention which is directed to apparatus for protecting electrical devices from ambient conditions while providing electrical connections to the device. The apparatus includes a housing having an opening and in which the electrical device is mounted. A printed circuit board comprising an insulating substrate and electrical connections for connecting device leads to corresponding ones of external leads. The electrical connections include plated through apertures extending through the substrate in which the device leads are inserted from inside the housing and the external leads are inserted from outside the housing. The leads are secured in the plated through apertures by solder. The apparatus further printed circuit board over the opening in the housing to form an air tight and water tight seal.

Preferably, the apertures in the substrate include first apertures in which the device leads are secured by solder and second apertures in which the external leads are secured by solder. Conductive traces on the substrate electrically connect the first and second apertures for corresponding device leads and external leads.

Preferably, the printed circuit board has an electrically insulative material applied over at least the solder connections on the external side of the printed circuit board. Most preferably, the insulative material is a potting material which is contained within potting dams surrounding the portions of the printed circuit board which are to be potted.

As another aspect of the invention, components can be mounted on either side of the printed circuit board. In addition, components such as connectors for the external wiring and indicators such as, for instance, light emitting diodes (LEDs) can be supported in the potting dam.

The invention has particular application to network protector relays. The components mounted on the printed circuit board forming the seal for the housing can include, for instance, auxiliary current transformers, and burden resistors which convert the sensed currents into voltages for input to the relay. These components can be on either side of the printed circuit board, but preferably the burden resistors are on the inside and the auxiliary current transformers are on the outside.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENT

The invention will be described as applied to the protection of a network protector relay to which it has particular application. It will be realized, however, that the invention has further application to the protection of other types of electrical devices from ambient conditions while providing connections between the device and external wiring which are both air tight and water tight.

Figure 1:
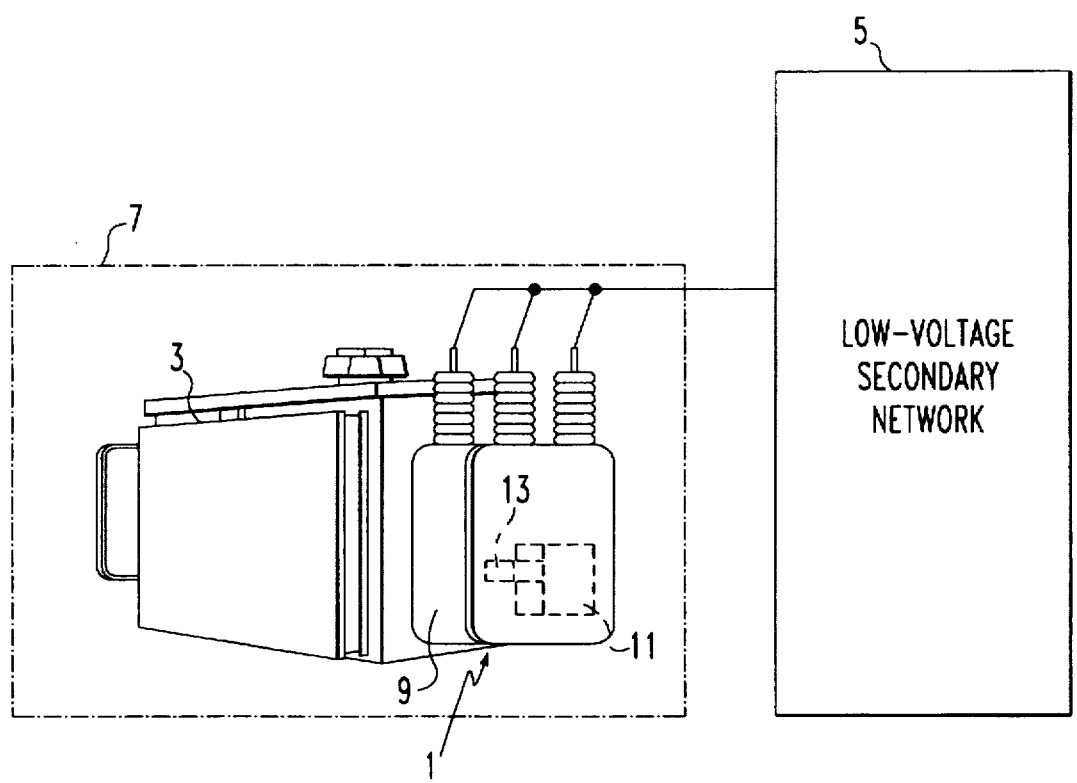
FIG. 1 is a schematic view of a network transformer having a network protector including a network protector relay incorporating the invention.

FIG. 1 illustrates a network protector 1 used in conjunction with a transformer 3 feeding a network 5, which for instance could service a section of a city, a large building, an industrial site or other local electrical distribution systems. The network 5 is fed by a number of other transformers (not shown) similar to the transformer 3. Often, the transformer 3 with its network protector 1 is installed in an underground vault 7 in which water can accumulate. Thus, the network protector 1 is housed in a water and air tight tank 9.

The network protector 1 includes a circuit breaker 11 and a relay unit 13. A major function of the relay unit 13 is to detect abnormal current flow through the transformer which could include flow of current out of the network 5 through the transformer 3 in the event of certain fault conditions.

Figure 2:
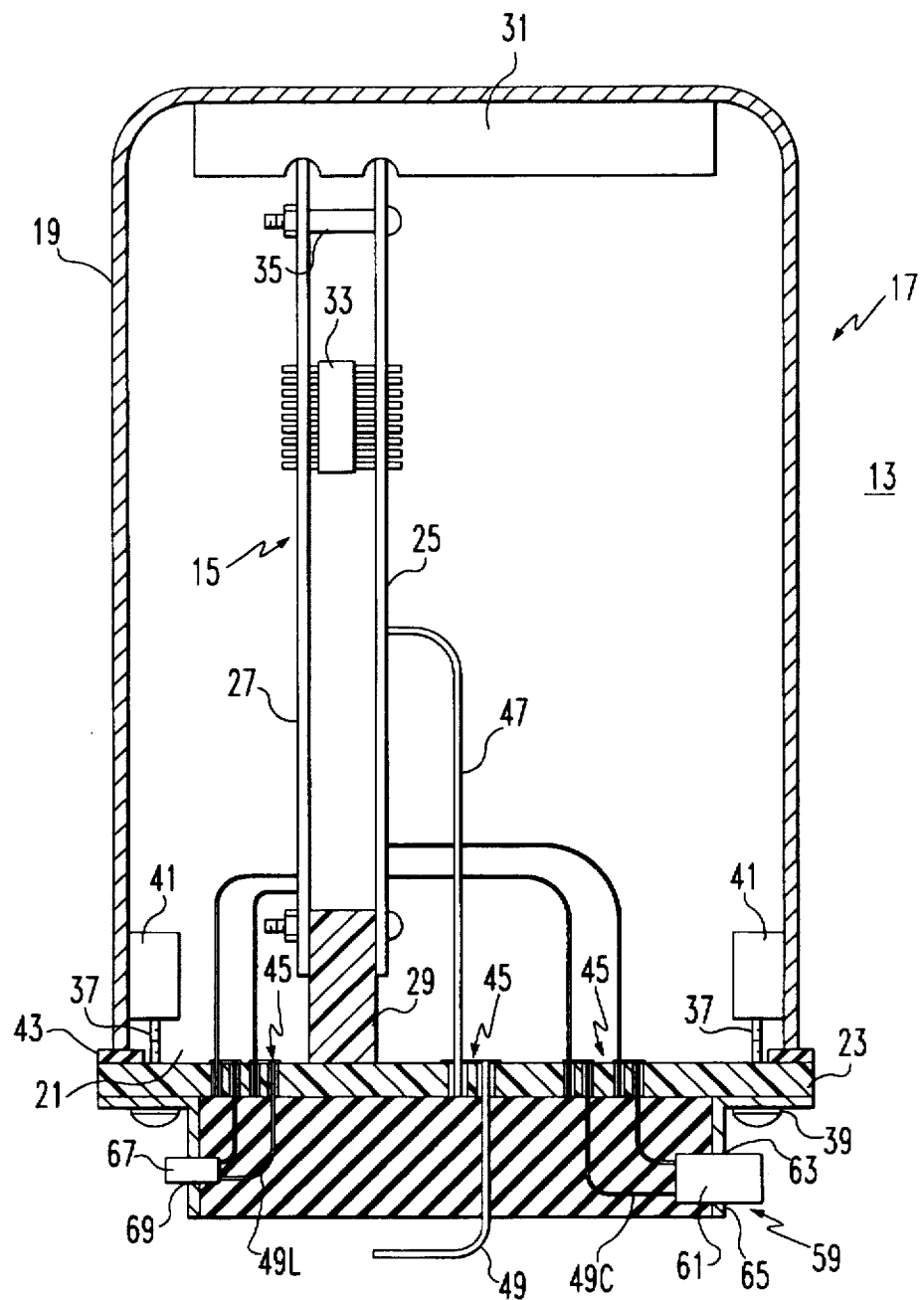
FIG. 2 is a longitudinal section through a network protector relay and its housing in accordance with the invention.

The relay unit 13 includes a protective relay 15 and an enclosure 17 for the relay as seen in FIG. 2. The enclosure 17 includes a housing 19 having an opening 21 at one end, which, as will be seen, is closed by a closure in the form of a printed circuit board (PCB) 23.

The protective relay 15 in the preferred embodiment, is a digital relay which, for example, includes a power PCB 25 and a processor PCB 27 which are supported in spaced relation at one end by a mounting spacer 29 secured to the PCB 23 which serves as a mother board, and at the other end by a notched locator bracket 31 secured to the housing 19. Electrical connections between the power PCB 25 and the processor PCB 27 are made by inter-board connectors 33. A spacer 35 maintains a fixed spacing between the boards at the ends supported by the PCB locator 31.

The printed circuit board 23 serves as a cover for the opening 21 in the housing. The board 23 is secured over the opening 21 by screws 37 extending through the PCB 23 and sealed with O rings 39. The screws 37 thread into mounting bosses 41 brazed to the inside of the housing 19. A gasket 43 is clamped between the printed circuit board 23 and the housing 19 to provide a water and air tight seal.

The printed circuit board 23 also provides connections 45 between relay leads 47 and external leads 49.

As seen more clearly in FIGS. 3 and 4A–C and 5A–C, the electrical connections 45 include plated through apertures 51 in the printed circuit board 23. In the preferred form of the invention, stripped ends 47w of the relay leads 47 are inserted into first apertures 51a from the inner side 23a of the printed circuit board and secured in place by solder 53. Similarly, the stripped end 49w of the corresponding external lead 49 is inserted from the outer side 23b of the printed circuit board into a corresponding second plated through aperture 57b spaced laterally from the aperture 51a and is also filled with solder 53. The solder 53 is introduced into the apertures 5a from the outer side 23b of the printed circuit board 23, while additional solder 53 is introduced into the apertures 51b from the inner side 23a of the printed circuit board where there is no interference from the lead being connected. In this manner, a sound solder connection which is air tight and water tight can be easily made. The corresponding solder filled apertures 51a and 51b are electrically connected by an associated electrically conductive trace 55 on the PCB 23. Such connected traces can be made on either or both sides of the printed circuit board 23.

Figure 3:
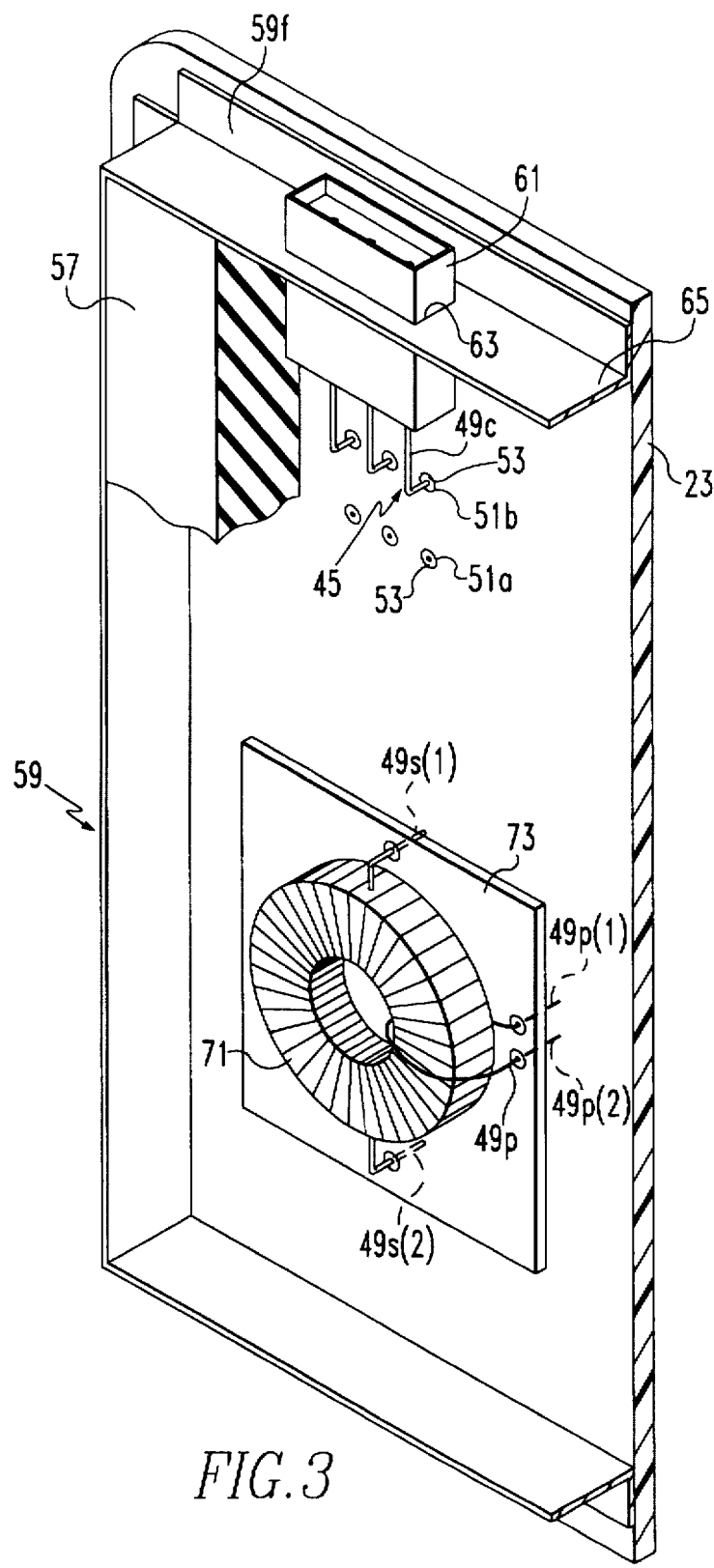
FIG. 3 is an isometric view of a printed circuit board which forms part of the relay enclosure shown with parts cut away.
Figure 5A:
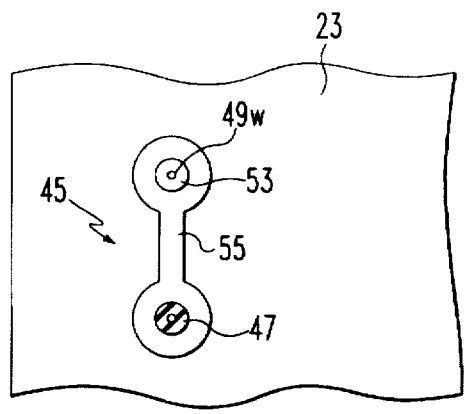
FIGS. 5A–5C are plan views of the connections of FIGS. 4A–4C.

Even where the conductive traces 55 are on the inner side 23a of the printed circuit board 23, there are exposed electrical connections on the outer side 23b. In order to electrically insulate such connections, a potting material 57 can be applied to the outer side 23b of the printed circuit board 23. Preferably, as seen in FIGS. 2 and 3, a potting dam 59 surrounds the section of the printed circuit board 23 that is to be potted. For example, an aluminum angle piece can have one flange 59f cut at the corners and bent to form an enclosure. The cut flanges are secured to the printed circuit board, such as, for example, by the mounting screws 37.

The potting dam 59 not only confines the potting material 57, but can also serve as mounts for various types of components. For instance, connectors such as the communications connector 61 can be mechanically mounted in an opening 63 in the upright flange 65 of the potting dam 59. External leads 49c connected to these connectors 61 are then bent at a right angle to penetrate the PCB 23 through a connection 45 as described above.

Another example of a component which can be supported by the potting dam 59 is the light emitting diode (LED) 67 which is mounted in an opening 69 in the upright flange 65 of the potting dam 59. Again, the external leads 471 for the LED are bent at right angles and are connected to the printed circuit board 23 by a connection 45.

Figure 4A:
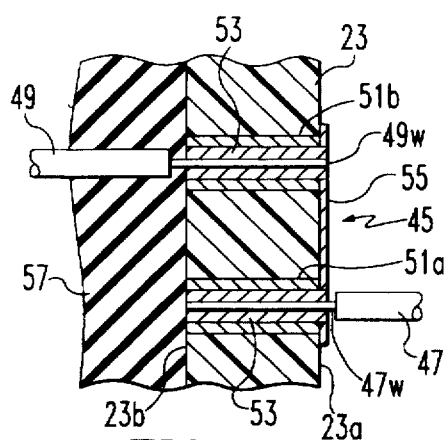
FIGS. 4A–4C are fragmentary cross sectional views through portions of the print circuit board showing lead connections in accordance with three embodiments of the invention.
Figure 4B:
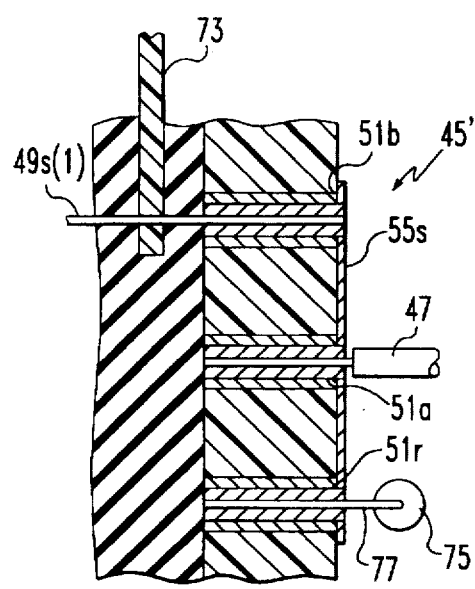
Figure 5B:
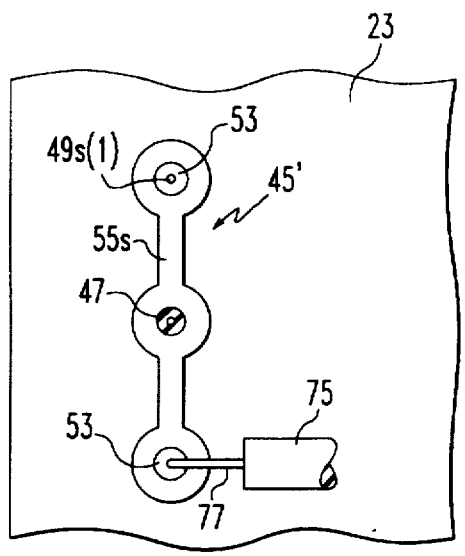
Figure 4C:
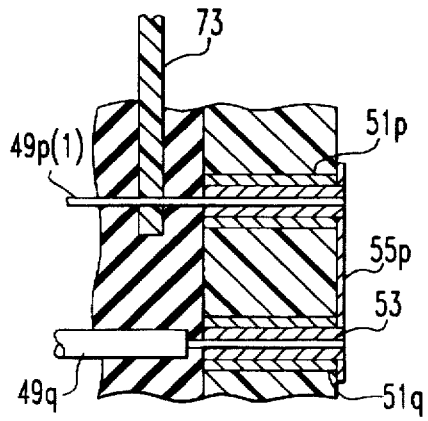
Figure 5C:
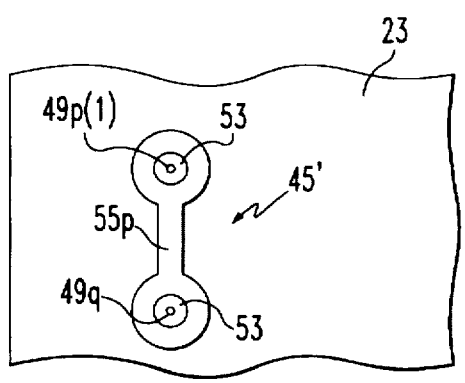

Still another example of a component mounted on the printed circuit board 23 forming the closure for the housing 19 is an auxiliary current transformer (CT) 71. As shown in FIG. 3, such auxiliary CTs 71 come mounted on a platform 73 having four pins $49p(1)$, $49p(2)$, and $49s(1)$ and $49s(2)$, which form electrical connections for the primary and secondary windings of the CT as well as mechanically supporting the CT 71 on the printed circuit board 23. The pins $49p(1)$ and $49p(2)$ for the primary winding of the CT formed by the wire 49p are inserted into third plated through apertures 51p from the outer side 23b of the printed circuit board 23 as shown in FIGS. 4C and 5C. As the CT primary windings 49p are connected to main CTs (not shown) external to the enclosure 17, the corresponding leads 49q connected to the main CTs also penetrate fourth apertures 53q from the outer side 23b of the PCB 23. The corresponding apertures 51p and 51q are connected on the inner side 23a of the PCB 23 by the associated conductive traces 55p to complete the connections 45'. Other components, typically mounted on platforms, can be mounted to the printed circuit board 23 in a similar manner either on the inner side 23a or the outer side 23b.

Another example of a component which can be mounted on the PCB 23 is a burden resistor 75 for converting the currents sensed by the CTs into voltages for input to the relay. In this case, each connection 45" for the ends of the burden resistor 75 include, as shown in FIGS. 4B and 5B, three apertures: a first aperture 51a in which the lead to the relay is soldered, a second aperture 51b to which a pin $49s(1)$ for the secondary coil of the CT 71 is soldered and an additional aperture 51r in which one lead 77 from the burden resistor 75 is soldered by solder 53. These three apertures are then connected by an associated common conductive trace 55s. A similar connection is made to the other end of the burden resistor, CT secondary winding and relay lead so that the burden resistor 75 is connected across the secondary winding of the auxiliary CT 71.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. A network protector unit comprising:

a housing having an opening;

a relay mounted inside said housing and having relay leads extending therefrom;

external leads outside said housing;

a printed circuit board having air tight and water tight electrical connections connecting said relay leads to said external leads;

means securing said printed circuit board across said opening to form an air tight and water tight seal for said housing;

wherein said printed circuit board comprises an insulative substrate, and said air tight and water tight electrical connections comprise plated through apertures extending through said substrate and in which said relay leads are inserted from inside said housing and said external leads are inserted from said outside said housing and in which said relay leads and external leads are secured by solder;

wherein said apertures include first plated through apertures in which said relay leads are inserted from inside said housing and secured with solder and second plated through apertures in which said external leads are inserted from outside said housing and secured with solder, and wherein said air tight and water tight connections further include associated conductive traces on said substrate electrically connecting corresponding ones of said first and second plated through apertures;

wherein said printed circuit board has potting material applied over at least some connections on an outer side of said substrate external to said housing; and wherein said printed circuit board has a potting dam confining said potting material applied to said external said of said substrate.

2. The network protecter relay unit of claim 1 including components supported in said potting dam, connected to said external leads and wherein said potting material electrically insulates said external leads connected to said components.

3. Apparatus protecting from ambient conditions an electrical device having device leads connecting to external leads, said apparatus comprising:

a housing having an opening and in which said electrical device is mounted;

a printed circuit board having a substrate and electrical connections connecting said device leads to corresponding ones of said external leads, said electrical connections including apertures extending through said substrate in which said device leads are inserted from inside said housing and said external leads are inserted from outside said housing and in which said device leads and external leads are secured by solder;

means securing said printed circuit board over said opening to form an air tight and water tight seal for said housing;

wherein said apertures in said substrate comprise first plated through apertures in which the device leads are secured by said solder and second plated through apertures in which said external leads are secured by said solder, and conductive traces on said substrate electrically connecting said first apertures with said second apertures for corresponding device leads and external leads; and dam means confining said electrically insulative material on said side of said printed circuit boards.

4. Apparatus protecting from ambient conditions an electrical device having device leads connecting to external leads, said apparatus comprising:

a housing having an opening and in which said electrical device is mounted;

a printed circuit board having a substrate and electrical connections connecting said device leads to corresponding ones of said external leads, said electrical connections including apertures extending through said substrate in which said device leads are inserted from inside said housing and said external leads are inserted from outside said housing and in which said device leads and external leads are secured by solder;

means securing said printed circuit board over said opening to form an air tight and water tight seal for said housing;

wherein said means securing said printed circuit board across said opening includes a sealing gasket and fastening means clamping said sealing gasket between said printed circuit board and said housing around said opening;

wherein said printed circuit board further has electrically insulative material applied over said solder on an external side of said printed circuit board; and components supported by said dam means and connected to said external leads which are electrically insulated by said electrically insulative materials.

\* \* \* \* \*